(12) United States Patent
Skirmont et al.

(10) Patent No.: US 8,477,508 B2
(45) Date of Patent: Jul. 2, 2013

(54) TILTED PRINTED CIRCUIT BOARD INSTALLATION

(75) Inventors: David A. Skirmont, Los Gatos, CA (US); Daniel K. Kilkenny, Pleasanton, CA (US)

(73) Assignee: Brocade Communications Systems, Inc., San Jose, CA (US)

( * ) Notice: Subject to any disclaimer, the term of this patent is extended or adjusted under 35 U.S.C. 154(b) by 397 days.

(21) Appl. No.: 12/620,361

(22) Filed: Nov. 17, 2009

(65) Prior Publication Data

US 2011/0116245 A1    May 19, 2011

(51) Int. Cl.
*H05K 5/00*   (2006.01)
(52) U.S. Cl.
USPC ........... 361/752; 361/803; 361/759; 361/804; 361/758; 361/742
(58) Field of Classification Search
USPC ................ 361/752, 803, 759, 804, 758, 74, 361/2
See application file for complete search history.

(56) References Cited

U.S. PATENT DOCUMENTS

| 4,084,874 | A  | * | 4/1978  | Georgopulos    | 439/326  |
|-----------|----|---|---------|----------------|----------|
| 4,862,400 | A  | * | 8/1989  | Selbrede       | 361/752  |
| 5,227,664 | A  | * | 7/1993  | Toshio et al.  | 257/723  |
| 7,035,111 | B1 | * | 4/2006  | Lin et al.     | 361/748  |
| 7,443,694 | B1 | * | 10/2008 | Chen et al.    | 361/801  |
| 2003/0137814 | A1 | * | 7/2003 | Kucharski     | 361/780  |
| 2004/0266249 | A1 | * | 12/2004 | Dobbs et al. | 439/376  |
| 2005/0186810 | A1 | * | 8/2005  | Sardella et al. | 439/76.1 |
| 2006/0104040 | A1 | * | 5/2006  | Hsu           | 361/752  |

\* cited by examiner

*Primary Examiner* — Tuan T Dinh
*Assistant Examiner* — Steven Sawyer
(74) *Attorney, Agent, or Firm* — Bever, Hoffman & Harms, LLP; E. Eric Hoffman

(57) ABSTRACT

A blade for a chassis-based system includes a printed circuit board (PCB) mounted at a tilt angle within the blade. The tilt angle provides space above or below the PCB at the front end of the blade, such that media interface modules can be flexibly positioned within the blade. A tilt angle that positions the PCB higher near the front end of the blade may enable media interface modules mounted in a belly-to-belly configuration on the PCB to be fitted within the front end of the blade. A tilt angle that positions the PCB lower near the front end of the blade may enable media interface modules mounted on the upper surface of the PCB to be fitted within the first end of the blade. The tilt angle also positions a backplane connector mounted on the PCB to properly engage a backplane when the blade is inserted into a slot.

12 Claims, 6 Drawing Sheets

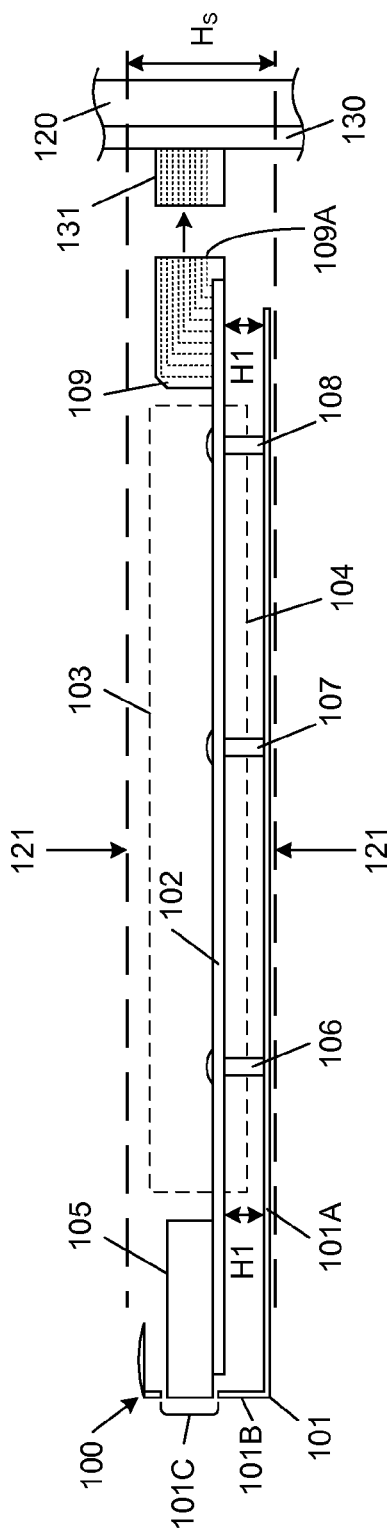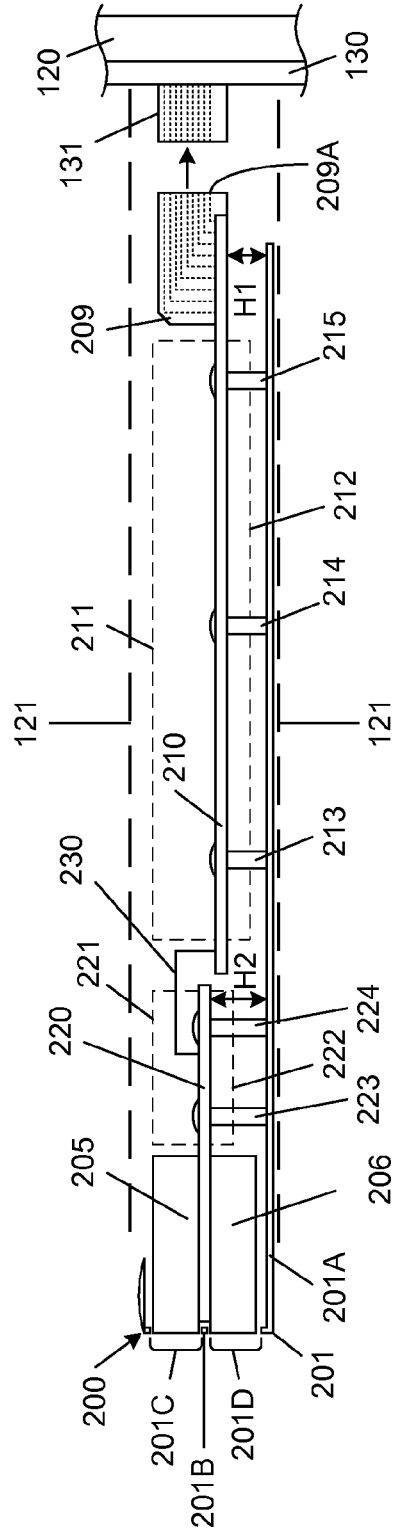

US 8,477,508 B2

TILTED PRINTED CIRCUIT BOARD INSTALLATION

FIELD OF THE INVENTION

The present invention relates to a blade used in a chassis-based system. More specifically, the present invention relates to the tilted installation of a printed circuit board within a blade.

RELATED ART

FIG. 1A is an isometric view of a conventional rack-mountable blade 100, which includes blade pan assembly 101, printed circuit board (PCB) 102, blade hardware 103-104, media interface module 105, PCB mounting structures 106-108 and high density backplane connector 109. FIG. 1B is a cross-sectional view of blade 100 along section line B-B of FIG. 1A. FIG. 1B also illustrates a portion of a chassis 120 having an associated slot 121 for receiving blade 100, along with a portion of a backplane 130, which is coupled to chassis 120, and a high density backplane connector 131, which is coupled to backplane 130.

Blade pan assembly 101 includes a flat bottom portion 101A, and an upright faceplate portion 101B. Blade pan assembly 101 is typically formed from sheet metal. PCB 102 is attached to the flat bottom portion 101A of blade pan assembly 101 by PCB mounting structures 106-108. As illustrated in FIG. 1B, each of the PCB mounting structures has the same fixed height H1, such that PCB 102 is positioned a fixed height H1 above, and in parallel with, the flat bottom portion 101A.

Blade hardware 103 and 104 includes integrated circuit chips, discrete circuit elements (e.g., resistors and capacitors), heat sinks and/or interconnect structures, which are located on the upper and lower surfaces of PCB 102, respectively. As described below, the height of the upper blade hardware 103 is greater than the height of the lower blade hardware 104.

Media interface module 105 is attached to the upper surface of PCB 102. The media interface module 105 can be fixed (as described herein) or pluggable (wherein module 105 is a connector on PCB 102). Media interface module 105 is coupled to electronic circuitry in blade hardware 103/104 by conductive traces in PCB 102. A portion of media interface module 105 is exposed through an opening 101C in the faceplate portion 101B of blade pan assembly 101. The exposed portion of media interface module 105 includes a port structure that allows for the connection of a network cable (e.g., an Ethernet cable, or an optical cable).

High density backplane connector 109 is attached to the upper surface of PCB 102, at the end opposite media interface module 105. High density backplane connector 109 includes a plurality of connector elements (represented by dashed lines in FIG. 1B) that are connected to conductive traces on PCB 102 and extend to a back end 109A of high density backplane connector 109.

Blade 100 is inserted into slot 121 within a chassis 120. Note that this slot 121 is typically defined by side support elements of chassis 120 (not shown), which engage lateral edges of the blade pan assembly 101. A backplane 130 is attached to the chassis 120. Backplane 130 includes electrical pathways that allow different blades in chassis 120 to communicate. A high density backplane connector 131 is attached to backplane 130 at a predetermined fixed location within slot 121. High-density backplane connector 131 is configured to engage with high density backplane connector 109 (i.e., in a plug/socket configuration) when blade 100 is fully inserted into slot 121. Once engaged, the high density backplane connectors 109 and 131 provide electrical connections between PCB 102 and backplane 130.

One of the design considerations associated with blade 100 is the slot height H. It is desirable to minimize the slot height $H_S$ in order to maximize the number of blades that can fit in a chassis. Another design consideration associated with blade 100 is the location of particular circuit elements on PCB 102. Shorter, cool-operating passive parts are typically located on the lower surface of PCB 102 (i.e., blade hardware 104), and taller, hot-operating active parts are typically located on the upper surface of PCB 102 (i.e., blade hardware 103). In order to minimize the height of blade 100 (and therefore the required slot height $H_S$) PCB 102 is positioned at a height H1 that is relatively close to the flat bottom portion 101A of blade pan assembly 101. Note that positioning PCB 102 at the middle of the slot height $H_S$ is not optimal (because such positioning would undesirably, and unnecessarily, increase the required slot height).

The height H1 is insufficient to allow a conventional media interface module (e.g., media interface module 105) to be mounted under the printed circuit board 102. That is, the height of a conventional media interface module is greater than the distance H1 that exists between the lower surface of PCB 102 and the upper surface of the flat bottom portion 101A of pan blade assembly 101. As a result, blade 100 is undesirably limited to a single row of media interface ports 105 across the faceplate portion 101B of blade pan assembly 101. (See, FIG. 1A.)

FIG. 2 is a cross-sectional view of another conventional rack-mountable blade 200, which allows two rows of media interface ports to be located at the front surface of blade 200. Blade 200 includes blade pan assembly 201, media interface modules 205-206, high-density backplane connector 209, PCB (motherboard) 210, motherboard hardware 211-212, motherboard mounting structures 213-215, PCB (daughterboard) 220, daughterboard hardware 213-214, daughterboard mounting structures 223-224, and bridge structure 230. Blade pan assembly 201 includes flat bottom portion 201A and upright faceplate portion 201B. Motherboard 210 and daughterboard 220 replace the single PCB 102 of blade 100. Motherboard hardware 211 and daughterboard hardware 221 roughly corresponds with blade hardware 103 of blade 100 (although daughterboard hardware 221 is typically designed to have a smaller height than motherboard hardware 221, such that the overall height of slot 121 does not have to be increased in view of the height of daughterboard 220). Similarly, motherboard hardware 212 and daughterboard hardware 222 roughly corresponds with blade hardware 104 of blade 100.

Motherboard 210 is attached to the flat bottom portion 201A of blade pan assembly 201 by mounting structures 213-215. As illustrated in FIG. 2, each of the mounting structures 213-215 has the same fixed height H1 as PCB mounting structures 106-108 (FIG. 1B), such that motherboard 210 is positioned a fixed height H1 above, and in parallel with, the flat bottom portion 201A. As a result, high-density backplane connector 209 of blade 200 is positioned in the same manner as high-density backplane connector 109 of blade 100. As a result, high-density backplane connector 209 properly engages high-density backplane connector 131 on backplane 130 when blade 200 is inserted into slot 121.

Daughterboard 220 is attached to the flat bottom portion 201A of blade pan assembly 201 by mounting structures 223-224. As illustrated in FIG. 2, each of the mounting structures 223-224 has the same fixed height H2, wherein height H2 is greater than height H1. The height H2 is selected such that media interface module 205 may be attached to the upper surface of daughterboard 220, and media interface module 206 may be attached to the lower surface of daughterboard 220, as illustrated. That is, media interface modules 205 and 206 are connected in a belly-to-belly configuration, on opposite sides of daughterboard 220. As illustrated in FIG. 2, media interface modules 205 and 206 are exposed through openings 201C and 201D, respectively, in the faceplate portion 201B of blade pan assembly 201. Because blade 200 allows two rows of media interface modules to be implemented in a belly-to-belly configuration, blade 200 may advantageously include twice as many media interface modules as blade 100.

However, the dissimilar heights of motherboard 210 and daughterboard 220 necessitate the use of a bridge structure 230 between motherboard 210 and daughterboard 220. Bridge structure 230 includes a plurality of conductive paths, which enable signals to be transmitted between motherboard 210 and daughterboard 220. Bridge structure 230 can include, for example, a high-speed connector and/or ribbon cable.

Blade 200 exhibits the following disadvantages with respect to blade 100. Blade 200 will have higher materials costs than blade 100, because blade 200 requires an extra PCB (i.e., daughterboard 220), as well as the additional hardware associated with the bridge structure 230. Blade 200 will also have higher assembly costs, because blade 200 requires the installation of the extra PCB 220 and the bridge structure 230. In addition, signal integrity is degraded by the use of bridge structure 230, which requires that signals be transmitted off of PCBs 210 and 220. The bridge structure 230 also creates a bottleneck for signals transmitted between PCB 210 and PCB 220. The two-PCB structure of blade 200 also results in less effective PCB area for components, as components cannot be placed in the gap between PCB 210 and PCB 220.

It would therefore be desirable to have an improved blade structure, which allows the use of two rows of media interface modules (or larger media interface modules), but does not exhibit the disadvantages associated with the motherboard/daughterboard design of blade 200.

SUMMARY

Accordingly, the present invention provides an improved blade, which includes a single printed circuit board mounted at a tilt angle within a blade pan assembly. The single printed circuit board extends substantially the entire depth of the blade (i.e., from the front end of the blade to the rear end of the blade). In one embodiment, the tilt angle causes the front end of the printed circuit board (i.e., the end of the printed circuit board located adjacent to the front end of the blade) to be positioned slightly higher than the rear end of the printed circuit board (i.e., the end of the printed circuit board located adjacent to the read end of the blade). This configuration provides additional space below the printed circuit board at the front end of the blade. This configuration allows media interface modules mounted in a belly-to-belly configuration at the front end of the printed circuit board to be fitted into the front end of the blade.

In another embodiment, the tilt angle causes the front end of the printed circuit board to be positioned slightly lower than the rear end of the printed circuit board. This configuration provides additional space above the printed circuit board at the front end of the blade. This configuration allows relatively tall media interface modules mounted on the upper surface of the front end of the printed circuit board to be fitted into the front end of the blade.

A high-density backplane connector may be mounted at the rear edge of the printed circuit board. In one embodiment, the tilt angle of the printed circuit board is not large enough to prevent the high-density backplane connector from properly engaging a corresponding connector element on a backplane when the blade is inserted into a slot of a chassis. In an alternate embodiment, a shim that exhibits the tilt angle is located between the printed circuit board and the high-density backplane connector, thereby leveling the high-density backplane connector. In another embodiment, a surface of the high-density backplane connector that is coupled to the printed circuit board is fabricated to exhibit the tilt angle, thereby leveling the high-density backplane connector.

The present invention will be more fully understood in view of the following description and drawings.

BRIEF DESCRIPTION OF THE DRAWINGS

FIG. 1B is a cross sectional view of the blade of FIG. 1A along section line B-B of FIG. 1A.

FIG. 2 is a cross-sectional view of another conventional rack-mountable blade, which includes two PCBs and two rows of media interface modules.

DETAILED DESCRIPTION

Figure 1A:
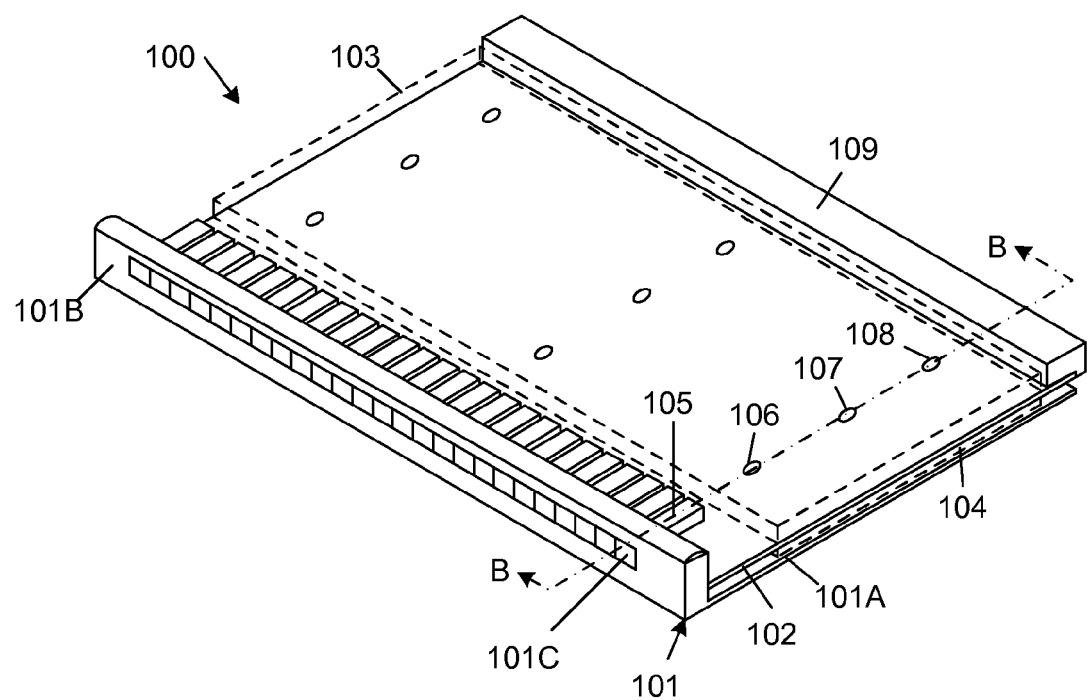
FIG. 1A is an isometric view of a conventional rack-mountable blade, which includes a single printed circuit board (PCB) and a single row of media interface modules.
Figure 3:
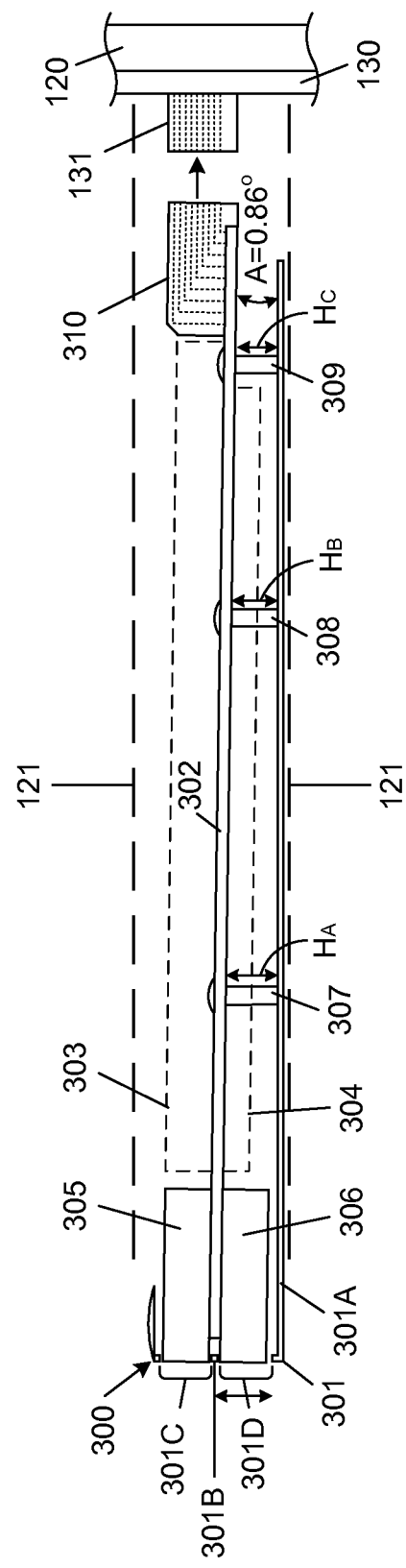
FIG. 3 is a cross-sectional view of a rack-mountable blade in accordance with one embodiment of the present invention.

FIG. 3 is a cross-sectional view of a rack-mountable blade 300 in accordance with one embodiment of the present invention. Blade 300 includes blade pan assembly 301, printed circuit board (PCB) 302, blade hardware 303-304, media interface modules 305-306, PCB mounting structures 307-309, and high-density backplane connector 310. FIG. 3 also illustrates a chassis 120, slot 121, backplane 130 and high-density interconnect socket 131, which are described above in more detail in connection with FIGS. 1A-1B and 2.

PCB 302 extends from the front edge of blade 300 to the rear edge of blade 300, as illustrated. Blade hardware 303 and 304 is located on the upper and lower surfaces of PCB 302, respectively, as illustrated in FIG. 3. Blade hardware 303 and 304 may include, for example, integrated circuit chips, discrete circuit elements (e.g., resistors and capacitors), heat sinks and/or interconnect structures, which are located on the upper and lower surfaces of PCB 302, respectively. In general, blade hardware 303-304 performs the required processing within blade 300. In the described embodiments, blade hardware 103 includes the tall, heat-generating parts of blade 300, while blade hardware 304 includes short, cooler-operating parts. Consequently, the height of blade hardware 304 is significantly less than the height of blade hardware 303.

Media interface modules 305 and 306 are mounted on the upper and lower surfaces of PCB 302, respectively, in a belly-to-belly configuration. As described herein, a media interface module includes a socket and a transceiver, wherein the transceiver can be plugged into (or pulled out of) the socket. The socket is physically mounted to the PCB 302 and is dimensioned to receive the transceiver. The socket includes a connector element, which provides electrical connections between the transceiver and conductive traces of the PCB 302 (when the transceiver is plugged into the socket). The transceiver includes a port (e.g., and optical port or an Ethernet port), which is exposed at the front end of blade 300 when the transceiver is plugged into the socket. In the described embodiments, media interface modules 305-306 are conventional modules, which are identical to media interface modules 105 (FIGS. 1A-1B) and 205-206 (FIG. 2). Media interface modules 305-306 are coupled to electronic circuitry in blade hardware 303/304 by conductive traces in PCB 302.

High-density backplane connector 310 is mounted on the upper surface of PCB 302. High-density backplane connector 310, which is identical to high-density backplane connectors 109 (FIGS. 1A-1B) and 209 (FIG. 2) in the present embodiment, includes electrical connections to PCB 302. As defined herein, media interface ports 305-306 are located at a front edge of PCB 302, and high density connector plug 310 is located at a rear edge of PCB 302.

Blade pan assembly 301 is substantially identical to blade pan assemblies 101 (FIGS. 1A-1B) and 201 (FIG. 2). Thus, blade pan assembly 301 includes a flat (planar) bottom portion 301A, which forms the bottom surface of blade 300, and an upright faceplate portion 301B, which forms the front surface of blade 300. Openings 301C and 301D, which extend through the faceplate portion 301B of blade pan assembly 301, expose media interface modules 305 and 306, respectively. Blade pan assembly 301 is formed from sheet metal in the described embodiments, although blade pan assembly 301 can be formed of other materials in other embodiments. PCB 302 is attached to the flat bottom portion 301A of blade pan assembly 301 by PCB mounting structures 307-309. As illustrated in FIG. 3, each of the PCB mounting structures 307-309 has a different height, such that PCB 302 is positioned at a slight angle with respect to the flat bottom portion 301A. In the described embodiments, the PCB mounting structures 307, 308 and 309 have heights $H_A$, $H_B$ and $H_C$, respectively, wherein $H_A > H_B > H_C$. In a particular embodiment, the heights $H_A$, $H_B$ and $H_C$ are selected such that PCB 302 is positioned at a tilt angle A of about 0.86 degrees, with respect to the flat bottom portion 301A of blade pan assembly 301. However, the tilt angle A can have other values in accordance with the guidance provided below. The tilt angle A depends on specific design tolerances, connectors used, PCB size, and whether the backplane connector 310 is shimmed (as described below).

The heights $H_A$-$H_C$ of PCB mounting structures 307-309 are selected such that the high-density backplane connector 310 is located at a height that allows this connector 310 to properly engage with the associated high-density backplane connector 131. The angle and heights will vary depending on media interface type and particulars of the blade design. In one embodiment, the height of the rear edge of PCB 302 is approximately equal to the height H1 (FIGS. 1B and 2). In this embodiment, the high-density backplane connector 310 mounted on PCB 302 is located at approximately the same height as the conventional high density backplane connectors 109 (FIG. 1B) and 209 (FIG. 2). Consequently, high-density backplane connector 310 will be properly connected to the corresponding high-density backplane connector 131 when blade 300 is inserted into the slot 121 of chassis 120. Note that even though the high-density backplane connector 310 is at a slight angle (e.g., 0.86°) with respect to the flat portion 310A of pan blade assembly 301, the tolerances of the high density backplane connectors 310 and 131 are sufficient to allow these connectors 310 and 131 to properly engage when blade 300 is inserted into slot 121. Stated another way, the tilt angle A is selected such that the insertion tolerances of the backplane connectors 310 and 131 are not exceeded.

When backplane connectors 310 and 131 are engaged, the tilt angle A introduces forces between the backplane 130 and PCB 302 (wherein these forces tend to straighten the tilt of PCB 302). Thus, in designing blade 300, all of these forces must be analyzed to ensure that no design allowances are exceeded.

Figure 4A:
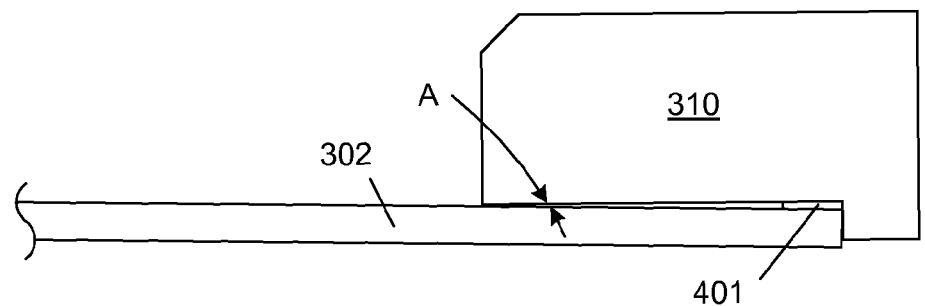
FIG. 4A is a cross-sectional view of a high-density backplane connector, which is leveled by a shim, in accordance with one embodiment of the present invention.
Figure 4B:
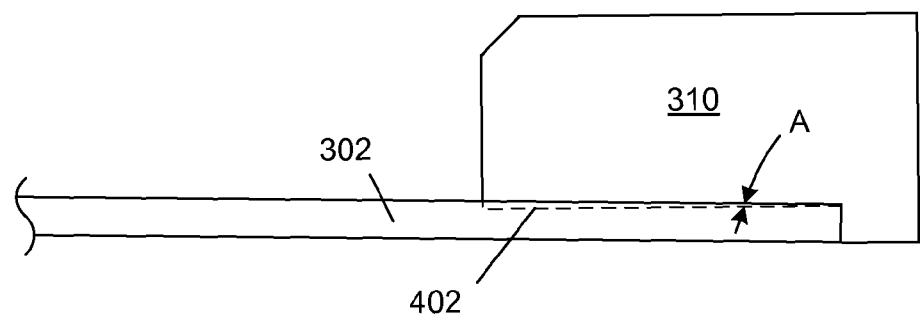
FIG. 4B is a cross sectional view of a modified high-density backplane connector, which can be used in the blade of FIG. 3, in accordance with one embodiment of the present invention.

FIGS. 4A and 4B are side views of high-density backplane connector 310 and PCB 302 in accordance with alternate embodiments of the present invention. As illustrated in FIG. 4A, a shim 401 may be inserted between high-density backplane connector 310 and PCB 302, wherein the shim 401 inclines the connector 310 by the angle A. As a result, shim 401 levels high-speed backplane connector 310, such that this connector 310 is positioned in parallel with the flat bottom portion 301A of blade pan assembly 301. In a particular embodiment, the thickest portion of shim 401 is on the order of ten thousandths of an inch. Note that the shim 401 is positioned at a location(s) where electrical connections between PCB 302 and high-density backplane connector 310 do not exist. Alternate embodiments may implement multiple shims between high-speed backplane connector 310 and PCB 302. In the embodiment of FIG. 4A, shim 401 may introduce forces between PCB 302 and backplane connector 310. Thus, in designing blade 300, all of these forces must be analyzed to ensure that no design allowances are exceeded.

As illustrated in FIG. 4B, the lower surface of high-density backplane connector 310 may be fabricated to have an angle that matches the tilt angle A of PCB 302. For example, a portion 402 of high-density backplane connector 310 may be removed by machining, or an equivalent process (i.e., connector 310 may simply be fabricated without portion 402). Eliminating portion 402 of high-density backplane connector 310 advantageously levels this connector 310, thereby improving the alignment with high-density backplane connector 131.

Figure 4C:
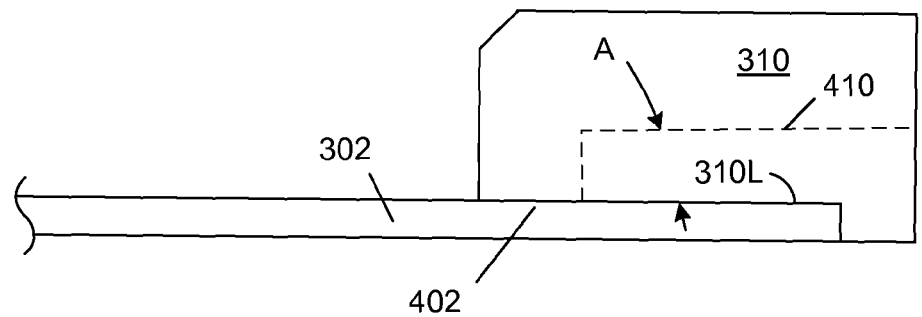
FIG. 4C is a cross sectional view of a modified high-density backplane connector having a tilted mating interface, which can be used in the blade of FIG. 3, in accordance with one embodiment of the present invention

As illustrated in FIG. 4C, the high-density backplane connector 310 may be fabricated such that the mating interface within connector 310 is situated at the tilt angle A, with respect to the lower surface 310L of connector 310. Dashed line 410 illustrates the mating interface of connector 310 in accordance with one embodiment of the present invention. Positioning the mating interface of connector 310 at the tilt angle A promotes the alignment and connection of connector 310 with high-density backplane connector 131.

Returning now to FIG. 3, the heights $H_A$-$H_C$ of PCB mounting structures 307-309 are further selected such that the front edge of PCB 302 is high enough to allow media interface modules 305 and 306 to be mounted in a belly-to-belly configuration on opposite sides of PCB 302. In one embodiment, the height of the front edge of PCB 302 is approximately equal to the height H2 of daughterboard 220 in blade 200 (FIG. 2). The tilt angle A of PCB 302 is selected to provide adequate clearance for media interface module 306 between PCB 302 and the flat bottom portion 301A of blade pan assembly 301, while also providing adequate clearance for media interface module 306 between PCB 302 and the upper boundary of blade 300.

In the embodiment illustrated by FIG. 3, the front surfaces of media interface modules 305-306 co-planar, but are not located in parallel with the vertical faceplate portion 301B of blade pan assembly 301. Rather, the front surfaces of media interface modules 305-306 are offset from the plane of the faceplate portion 301B by the tilt angle, A. As a result, media interface module 306 may protrude out through the faceplate portion 301B slightly more than media interface module 305.

Figure 5A:
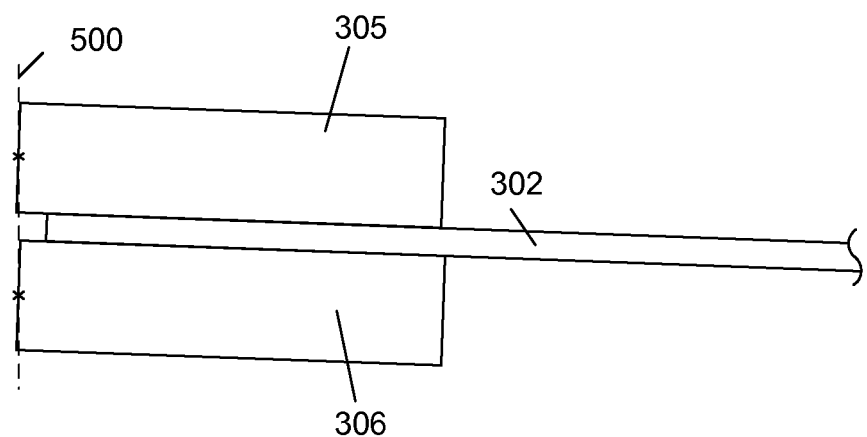
FIG. 5A is a cross-sectional view of belly-to-belly media interface modules, which are aligned with a common vertical plane in accordance with one embodiment of the present invention.
Figure 5B:
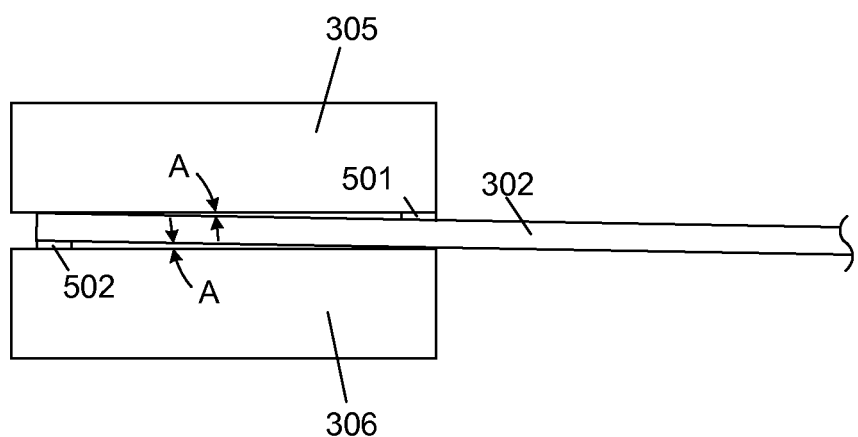
FIG. 5B is a cross-sectional view of belly-to-belly media interface modules, which are connected to a printed circuit board using shims in accordance with one embodiment of the present invention.

FIGS. 5A and 5B are cross sectional views of media interface modules 305-306 and PCB 302 in accordance with alternate embodiments of the present invention. As illustrated in FIG. 5A, media interface module 305 protrudes further past the front edge of PCB 302 than media interface module 306. As a result, media interface modules 305 and 306 protrude out through the faceplate portion 301B of blade pan assembly 301 by the same amount. In this embodiment, the front surfaces of media interface modules 305 and 306 are not co-planar. However, the front surfaces of media interface modules 305-306 are centered on a common vertical plane 500. That is, the centers of the front surfaces of media interface modules 305-306 (which are shown by x's in FIG. 5A) are located on the same vertical plane 500.

As illustrated in FIG. 5B, shims 501-502 may be inserted between media interface modules 305-306, respectively, and PCB 302. Shims 501-502 level media interface modules 305-306, respectively, by inclining/reclining these modules by the tilt angle A. As a result, media interface modules 305-306 are positioned in parallel with the flat bottom portion 301A of blade pan assembly 301.

Figure 6:
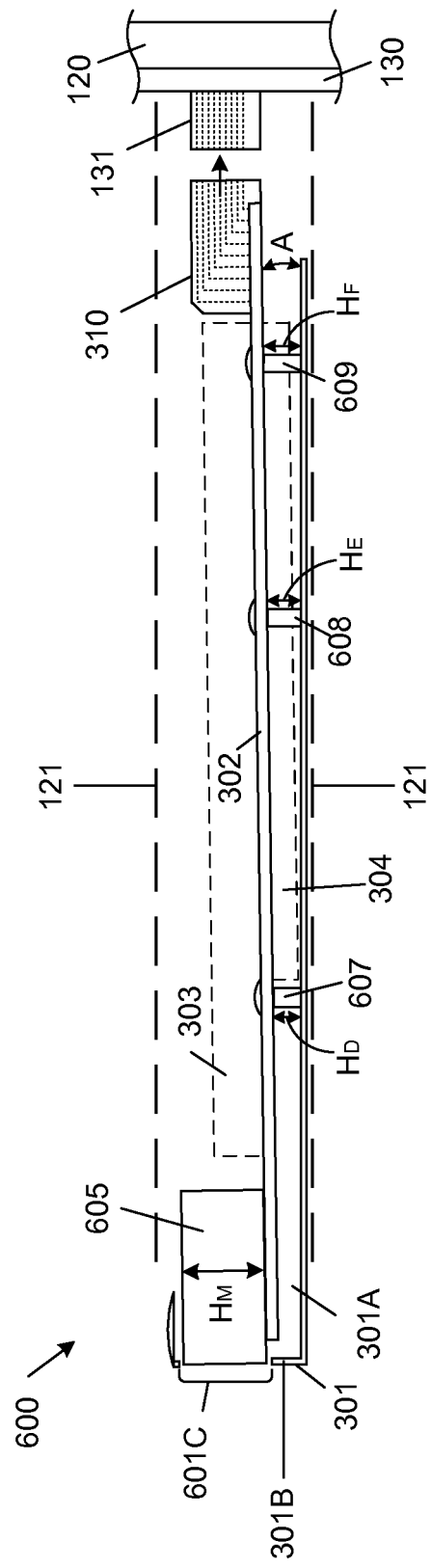
FIG. 6 is a cross-sectional view of a rack-mountable blade in accordance with an alternate embodiment of the present invention.

FIG. 6 is a cross-sectional view of a rack-mountable blade 600 in accordance with an alternate embodiment of the present invention. Because blade 600 is similar to blade 300, similar elements are labeled with similar reference numbers in FIGS. 3 and 6. Thus, blade 600 includes blade pan assembly 301, PCB 302, blade hardware 303-304 and high-density backplane connector 310, which have been described above in connection with FIG. 3. FIG. 6 also illustrates chassis 120, slot 121, backplane 130 and high-density interconnect socket 131.

PCB mounting structures 607-609 attach PCB 302 to the flat bottom portion 301A of blade pan assembly 301 in blade 600. PCB mounting structures 607, 608 and 609 have heights $H_D$, $H_E$ and $H_F$, respectively, wherein $H_D < H_E < H_F$. As a result, PCB 302 is positioned at a slight angle with respect to the flat bottom portion 301A, wherein the front edge of PCB 302 is lower than the rear edge of PCB 302.

Media interface module 605 is mounted on the upper surface of PCB 302, at the front edge of PCB 302. Media interface module 605 has a height $H_M$ that is greater than the heights of modules 105, 205-206 and 305-306. In blade 600, the upright faceplate portion 301B of blade pan assembly 301 is modified to include a relatively large opening 601C. This large opening 601C allows the relatively tall media interface module 605 to be exposed through faceplate portion 301B.

The downward tilt angle A of PCB 302 is selected to allow the relatively high media interface module 605 to be properly positioned at the front surface of blade 600. Note that without the downward tilt angle A, media interface module 605 would not fit within blade 600. (That is, the combined heights of media interface module 605, PCB 302 and blade hardware 304, plus the required clearances, would be greater than the height of the blade 600).

The exposed front surface of media interface module 605 is angled slightly downward in blade 600. In one embodiment, a shim may be inserted between media interface module 605 and PCB 302, thereby leveling media interface module 605 with respect to the flat bottom portion 301A of pan assembly 300. (See, e.g., FIG. 5B.)

The heights $H_D$-$H_F$ of PCB mounting structures 607-609 are selected such that the high-density backplane connector 310 is located at a height that allows this connector 310 to properly engage with the associated high-density backplane connector 131. The angle and heights will vary depending on media interface type and particulars of the blade design. The design considerations associated with connector 310 have been described above in connection with FIGS. 3 and 4A-4B, and apply equally within blade 600. For example, the high-density backplane connector 310 of blade 600 can be shimmed or machined in the manner described above in connection with FIGS. 4A-4B. Note that the shim (or machined) angle used in blade 600 would be reversed with respect to FIGS. 4A-4B.

Although the present invention has been described in connection with various embodiments, it is understood that variations of these embodiments would be obvious to one of ordinary skill in the art. For example, although three PCB support structures 307-309 (or 607-609) are shown along the length of PCB 302, it is understood that two (or more than three) PCB support structures can be used in alternate embodiments. Moreover, although PCB 302 has been described as being attached to the bottom portion 301A of pan assembly 301 by PCB support structures 307-309, it is understood that PCB 302 could be mounted at the tilt angle A by attaching PCB 302 to other surfaces (e.g., side surfaces) of pan assembly 301. Thus, the present invention is limited only by the following claims.

We claim:
1. A blade comprising:
a pan assembly having a first planar portion that forms a bottom surface of the blade;
a printed circuit board coupled to the pan assembly, wherein the printed circuit board is mounted such that a non-zero tilt angle exists between the printed circuit board and the first planar portion of the pan assembly;
a first blade hardware located on a first surface of the printed circuit board, wherein the first blade hardware exhibits a first height;
a second blade hardware located on a second surface of the printed circuit board, opposite the first surface, wherein the second blade hardware exhibits a second height that is less than the first height, and wherein the printed circuit board is located between the first blade hardware and the first planar portion of the pan assembly;
a first media interface module mounted on the second surface of the printed circuit board and exposed at a front end of the blade;
a second media interface module mounted on the first surface of the printed circuit board, wherein the second media interface module is exposed at the front end of the blade, wherein the non-zero tilt angle positions the printed circuit board farthest from the first planar portion of the pan assembly near the front end of the blade.

2. A blade comprising:
a pan assembly having a first planar portion that forms a bottom surface of the blade;
a printed circuit board coupled to the pan assembly, wherein the printed circuit board is mounted such that a non-zero tilt angle exists between the printed circuit board and the first planar portion of the pan assembly;
a first blade hardware located on a first surface of the printed circuit board, wherein the first blade hardware exhibits a first height;
a second blade hardware located on a second surface of the printed circuit board, opposite the first surface, wherein the second blade hardware exhibits a second height that is less than the first height, and wherein the printed circuit board is located between the first blade hardware and the first planar portion of the pan assembly;
a first media interface module mounted on the second surface of the printed circuit board and exposed at a front end of the blade; and
a backplane connector mounted on the first surface of the printed circuit board, wherein the first media interface module is located at a first end of the printed circuit board, and the backplane connector is located at a second end of the printed circuit board, opposite the first end of the printed circuit board, and wherein the backplane connector is exposed at a rear end of the blade, opposite the front end of the blade.

3. The blade of claim 2, wherein the non-zero tilt angle positions the second end of the printed circuit board closer to the first planar portion of the pan assembly than the first end of the printed circuit board.

4. The blade of claim 2, further comprising a first shim located between the backplane connector and the printed circuit board, wherein the shim positions the backplane connector in parallel with the first planar portion of the pan assembly.

5. The blade of claim 2, wherein a mounting surface of the backplane connector, which is mounted on the first surface of the printed circuit board, exhibits the non-zero tilt angle, whereby the backplane connector is positioned in parallel with the first planar portion of the pan assembly.

6. A blade comprising:
a pan assembly having a first planar portion that forms a bottom surface of the blade;
a printed circuit board coupled to the pan assembly, wherein the printed circuit board is mounted such that a non-zero tilt angle exists between the printed circuit board and the first planar portion of the pan assembly;
a first blade hardware located on a first surface of the printed circuit board, wherein the first blade hardware exhibits a first height;
a second blade hardware located on a second surface of the printed circuit board, opposite the first surface, wherein the second blade hardware exhibits a second height that is less than the first height, and wherein the printed circuit board is located between the first blade hardware and the first planar portion of the pan assembly;
a first media interface module mounted on the second surface of the printed circuit board and exposed at a front end of the blade, wherein the printed circuit board is located a first distance from the first planar portion of the pan assembly at the front end of the blade, and a second distance from the first planar portion of the pan assembly at a rear end of the blade, wherein the first distance is greater than the second distance.

7. A blade comprising:
a pan assembly having a first planar portion that forms a bottom surface of the blade;
a printed circuit board coupled to the pan assembly, wherein the printed circuit board is mounted such that a non-zero tilt angle exists between the printed circuit board and the first planar portion of the pan assembly;
a first blade hardware located on a first surface of the printed circuit board, wherein the first blade hardware exhibits a first height;
a second blade hardware located on a second surface of the printed circuit board, opposite the first surface, wherein the second blade hardware exhibits a second height that is less than the first height, and wherein the printed circuit board is located between the first blade hardware and the first planar portion of the pan assembly;
a first media interface module mounted on the second surface of the printed circuit board and exposed at a front end of the blade;
a second media interface module mounted on the first surface of the printed circuit board, wherein the second media interface module is exposed at the front end of the blade, wherein the pan assembly further comprises a faceplate portion located at the front end of the blade, wherein front surfaces of the first and second media interface modules are exposed through the faceplate portion, wherein the front surfaces are co-planar with one another, but are not located in parallel with the faceplate portion.

8. A blade comprising:
a pan assembly having a first planar portion that forms a bottom surface of the blade;
a printed circuit board coupled to the pan assembly, wherein the printed circuit board is mounted such that a non-zero tilt angle exists between the printed circuit board and the first planar portion of the pan assembly;
a first blade hardware located on a first surface of the printed circuit board, wherein the first blade hardware exhibits a first height;
a second blade hardware located on a second surface of the printed circuit board, opposite the first surface, wherein the second blade hardware exhibits a second height that is less than the first height, and wherein the printed circuit board is located between the first blade hardware and the first planar portion of the pan assembly;
a first media interface module mounted on the second surface of the printed circuit board and exposed at a front end of the blade;
a second media interface module mounted on the first surface of the printed circuit board, wherein the second media interface module is exposed at the front end of the blade, wherein the pan assembly further comprises a faceplate portion located at the front end of the blade, wherein front surfaces of the first and second media interface modules are exposed through the faceplate portion, wherein the front surfaces are not co-planar with one another.

9. A blade comprising:
a pan assembly having a first planar portion that forms a bottom surface of the blade;
a printed circuit board coupled to the pan assembly, wherein the printed circuit board is mounted such that a non-zero tilt angle exists between the printed circuit board and the first planar portion of the pan assembly;
a first blade hardware located on a first surface of the printed circuit board, wherein the first blade hardware exhibits a first height;

a second blade hardware located on a second surface of the printed circuit board, opposite the first surface, wherein the second blade hardware exhibits a second height that is less than the first height, and wherein the printed circuit board is located between the first blade hardware and the first planar portion of the pan assembly;

a first media interface module mounted on the second surface of the printed circuit board and exposed at a front end of the blade;

a second media interface module mounted on the first surface of the printed circuit board, wherein the second media interface module is exposed at the front end of the blade;

a first shim located between the first media interface module and the second surface of the printed circuit board, wherein the first shim positions the first media interface module in parallel with the first planar portion of the pan assembly; and a second shim located between the second media interface module and the first surface of the printed circuit board, wherein the second positions the second media interface module in parallel with the first planar portion of the pan assembly.

10. A blade comprising:

a printed circuit board that extends between a front end of the blade and a distal rear end of the blade, wherein the printed circuit board is mounted at an angle within the blade, such that the printed circuit board is higher at the front end of the blade than at the rear end of the blade;

a pair of media interface modules mounted on opposing surfaces of the printed circuit board in a belly-to-belly configuration, wherein the pair of media interface modules are exposed at the front end of the blade; and a faceplate located at the front end of the blade, wherein front surfaces of the pair of media interface modules are exposed through the faceplate, wherein the front surfaces are co-planar with one another, but are not located in parallel with the faceplate.

11. A blade comprising:

a printed circuit board that extends between a front end of the blade and a distal rear end of the blade, wherein the printed circuit board is mounted at an angle within the blade, such that the printed circuit board is higher at the front end of the blade than at the rear end of the blade;

a pair of media interface modules mounted on opposing surfaces of the printed circuit board in a belly-to-belly configuration, wherein the pair of media interface modules are exposed at the front end of the blade; and a faceplate located at the front end of the blade, wherein front surfaces of the pair of media interface modules are exposed through the faceplate, and wherein the front surfaces are not co-planar with one another.

12. A blade comprising:

a printed circuit board that extends between a front end of the blade and a distal rear end of the blade, wherein the printed circuit board is mounted at an angle within the blade, such that the printed circuit board is higher at the front end of the blade than at the rear end of the blade;

a pair of media interface modules mounted on opposing surfaces of the printed circuit board in a belly-to-belly configuration, wherein the pair of media interface modules are exposed at the front end of the blade;

a pan assembly including a first planar portion that forms a lower surface of the blade, wherein the angle exists between the printed circuit board and the first planar portion of the pan assembly; and shims located between the pair of media interface modules and the printed circuit board, wherein the shims position the pair of media interface modules in parallel with the first planar portion of the pan assembly.

* * * * *